United States Patent
Shimura et al.

(10) Patent No.: US 12,196,811 B2
(45) Date of Patent: Jan. 14, 2025

(54) POWER SUPPLY DEVICE AND FAILURE DETECTION METHOD FOR BATTERY

(71) Applicant: MURATA MANUFACTURING CO., LTD., Kyoto (JP)

(72) Inventors: Jusuke Shimura, Kyoto (JP); Gaku Kamitani, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 168 days.

(21) Appl. No.: 18/090,767

(22) Filed: Dec. 29, 2022

(65) Prior Publication Data
US 2023/0140632 A1  May 4, 2023

Related U.S. Application Data (63) Continuation of application No. PCT/JP2021/019193, filed on May 20, 2021.

(30) Foreign Application Priority Data

Jun. 29, 2020  (JP) .................................. 2020-112016

(51) Int. Cl.
G01R 31/374 (2019.01)
G01R 31/367 (2019.01)
G01R 31/3842 (2019.01)

(52) U.S. Cl.
CPC ......... *G01R 31/374* (2019.01); *G01R 31/367* (2019.01); *G01R 31/3842* (2019.01)

(58) Field of Classification Search
CPC .......................... G01R 31/374; G01R 31/367; G01R 31/3842; G01R 31/392; H01M 10/4285; H02J 7/0071
See application file for complete search history.

(56) References Cited

U.S. PATENT DOCUMENTS

| | | |
|---|---|---|
| 2010/0004885 A1 | 1/2010 | Nakanishi |
| 2010/0194398 A1 | 8/2010 | Kawasumi et al. |
| 2011/0187329 A1 | 8/2011 | Majima et al. |

(Continued)

FOREIGN PATENT DOCUMENTS

| | | |
|---|---|---|
| EP | 3092144 B1 | 11/2019 |
| JP | H0917458 A | 1/1997 |

(Continued)

OTHER PUBLICATIONS

International Search Report of corresponding PCT application PCT/JP2021/019193, dated Aug. 10, 2021.

(Continued)

*Primary Examiner* — Christopher E Mahoney
(74) *Attorney, Agent, or Firm* — K&L Gates LLP (57) ABSTRACT

A power supply device includes a measurement unit that measures at least one of a voltage and a current of a lithium ion battery, a peak detection unit that detects at least one of a maximum value of the current and a minimum value of the voltage at regular time intervals using at least one of the voltage and the current measured by the measurement unit, and a determination unit that determines a failure of the lithium ion battery based on at least one of the maximum value of the current and the minimum value of the voltage detected at regular time intervals by the peak detection unit.

6 Claims, 4 Drawing Sheets

(56) References Cited

U.S. PATENT DOCUMENTS

| | | | |
|---|---|---|---|
| 2015/0244165 A1 | 8/2015 | Roesner et al. | |
| 2016/0054389 A1 | 2/2016 | Koba et al. | |
| 2020/0044294 A1 | 2/2020 | Clarke et al. | |
| 2020/0081070 A1* | 3/2020 | Chemali | G06N 3/044 |
| 2020/0366117 A1 | 11/2020 | Yamaguchi | |
| 2024/0264236 A1* | 8/2024 | Shimura | G01R 31/3648 |

FOREIGN PATENT DOCUMENTS

| | | | |
|---|---|---|---|
| JP | 2003009405 A | 1/2003 | |
| JP | 2010066161 A | 3/2010 | |
| JP | 2010272365 A | 12/2010 | |
| JP | 2012003863 A | 1/2012 | |
| JP | 2014206441 A | 10/2014 | |
| JP | 2018096744 A | 6/2018 | |
| JP | 2019050168 A | 3/2019 | |
| WO | 1999/63613 A1 | 12/1999 | |
| WO | 2019156171 A1 | 8/2019 | |

OTHER PUBLICATIONS

Japanese Office Action issued Nov. 21, 2023 in corresponding Japanese Application No. 2022-533735.
European Search Report dated Aug. 6, 2024 for corresponding EP application No. 21832253.5 (11 pages).
Xia Bing et al.: "External short circuit fault diagnosis for lithium-ion batteries", 2014 IEEE Transportation Electrification Conference and Expo (ITEC), IEEE, Jun. 15, 2014, pp. 1-7.

\* cited by examiner

POWER SUPPLY DEVICE AND FAILURE DETECTION METHOD FOR BATTERY

CROSS REFERENCE TO RELATED APPLICATIONS

The present application is a continuation of PCT patent application no. PCT/JP2021/019193, filed on May 20, 2021, which claims priority to Japanese patent application no. JP2020-112016, filed on Jun. 29, 2020, the entire contents of which are herein incorporated by reference.

BACKGROUND

The present application relates to a power supply device and a failure detection method for a battery.

Conventionally, a technique for detecting a failure of a lithium ion battery by measuring a voltage or a current of the lithium ion battery has been studied. For example, a power supply device is proposed including: a voltage detection unit that detects the voltage between positive and negative terminals of the lithium ion battery; and a battery abnormality determination unit that determines occurrence of a micro-short circuit in which a detection value of the voltage detection unit instantaneously drops, and determines that the lithium ion battery is abnormal when an occurrence frequency of the micro-short circuit becomes equal to or higher than a setting frequency for abnormality determination.

SUMMARY

The present application relates to a power supply device and a failure detection method for a battery.

Conventionally, a use of lithium ion battery has been limited to technical fields such as notebook personal computers (PCs) and mobile phones, but in recent years, the lithium ion battery is expected to be used in various technical fields such as automobile including electric vehicles (EVs) and plug-in hybrid vehicles (PHVs), aircrafts, and power storage systems. For this reason, in recent years, development of a technique for detecting a failure of the lithium ion battery is more desired than ever before.

The present application relates to providing a power supply device and a failure detection method for a battery capable of detecting a failure of the lithium ion battery according to an embodiment.

In order to solve the problems described above, a power supply device is provided and including: a measurement unit that measures at least one of a voltage and a current of a lithium ion battery; a peak detection unit that detects at least one of a maximum value of the current and a minimum value of the voltage at regular time intervals using at least one of the voltage and the current measured by the measurement unit; and a determination unit that determines a failure of the lithium ion battery based on at least one of the maximum value of the current and the minimum value of the voltage detected at the regular time intervals by the peak detection unit according to an embodiment.

In an embodiment, the peak detection unit may be a peak holding unit that holds at least one of the maximum value of the current and the minimum value of the voltage at the regular time intervals from at least one of the voltage and the current measured by the measurement unit.

In an embodiment, the measurement unit may measure the voltage and the current, the peak detection unit may detect the maximum value of the current and the minimum value of the voltage at the regular time intervals using the voltage and the current measured by the measurement unit, and the determination unit may determine the failure of the lithium ion battery based on the maximum value of the current and the minimum value of the voltage detected at regular time intervals by the peak detection unit.

In an embodiment, a temperature measurement unit that measures a temperature of the lithium ion battery may be further included, and the determination unit may determine the failure of the lithium ion battery based on at least one of the maximum value of the current and the minimum value of the voltage detected by the peak detection unit, at least one of the voltage and the current measured by the measurement unit, and the temperature measured by the temperature measurement unit.

In an embodiment, a temperature measurement unit that measures a temperature of the lithium ion battery may be further included, and the determination unit may determine the failure of the lithium ion battery based on the maximum value of the current and the minimum value of the voltage detected by the peak detection unit, the voltage and the current measured by the measurement unit, and the temperature measured by the temperature measurement unit.

In an embodiment, the determination unit may determine the failure of the lithium ion battery using a learned model using a neural network.

In an embodiment, the regular time interval may be 1 minute or less.

A failure detection method for a battery is provided and including: measuring at least one of a voltage and a current of a lithium ion battery; detecting at least one of a maximum value of the current and a minimum value of the voltage at regular time intervals using at least one of the measured voltage and the measured current; and determining the failure of the lithium ion battery based on at least one of the maximum value of the current and the minimum value of the voltage detected at regular time intervals according to an embodiment.

According to the present application, it is possible to detect the failure of the lithium ion battery.

DETAILED DESCRIPTION

The present application will be described below in further detail including with reference to the figures according to an embodiment.

Figure 1:
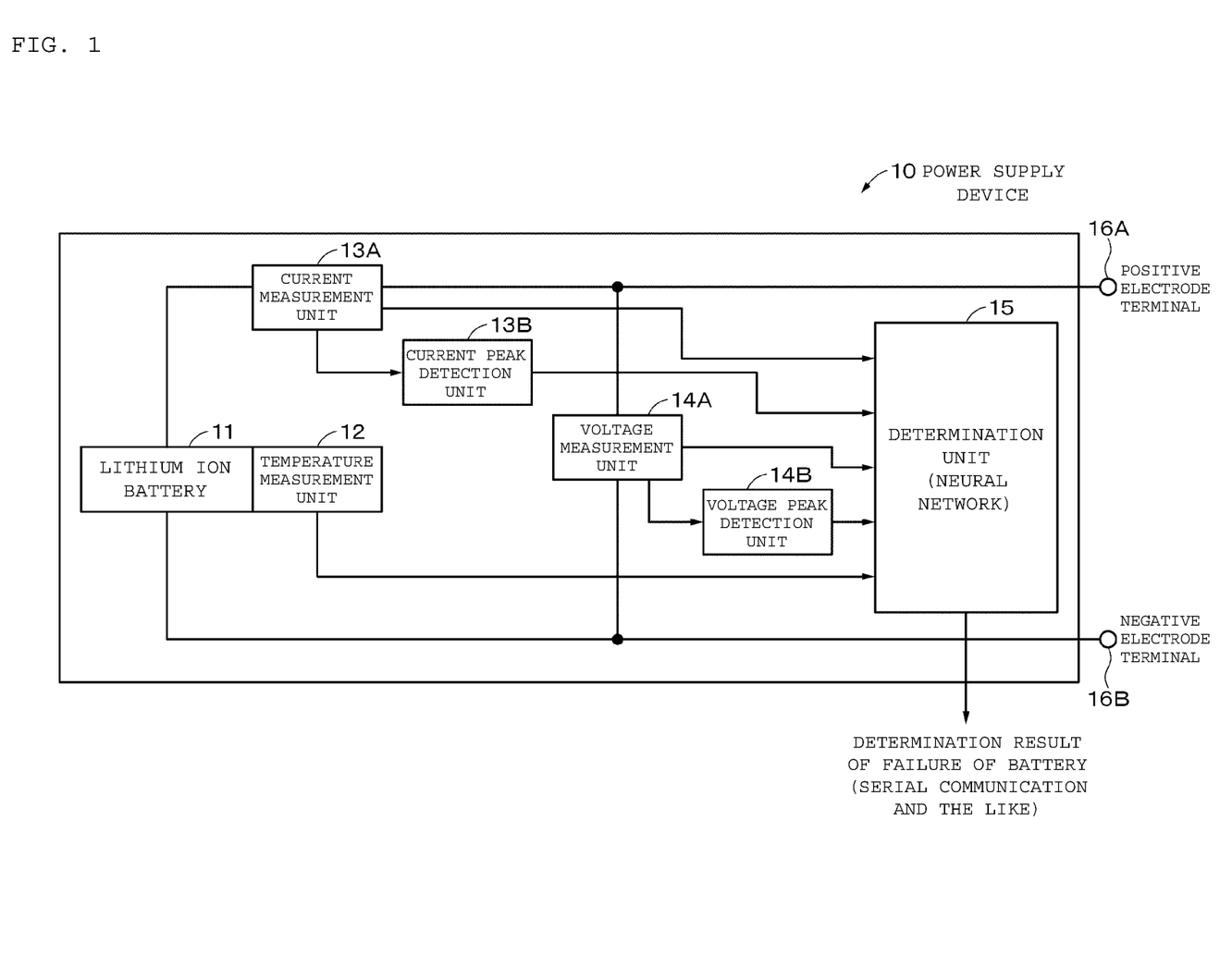
FIG. 1 is a block diagram illustrating an example of a configuration of a power supply device according to an embodiment of the present application.

FIG. 1 is a block diagram illustrating an example of a configuration of a power supply device 10 according to an embodiment. The power supply device 10 is a power supply device having the neural network realized by an information processing device. The power supply device 10 includes a secondary battery 11, a temperature measurement unit 12, a current measurement unit 13A, a current peak detection unit 13B, a voltage measurement unit 14A, a voltage peak detection unit 14B, a determination unit 15, a positive electrode terminal 16A, and a negative electrode terminal 16B. The power supply device 10 is preferably provided in electric vehicles (EV or PHV) or electric aircrafts.

The secondary battery 11 is a lithium ion battery. The positive electrode terminal of the secondary battery 11 is connected to the positive electrode terminal of a power supply source via the positive electrode terminal 16A. Furthermore, the negative electrode terminal of the secondary battery 11 is connected to the negative electrode terminal of the power supply source via the negative electrode terminal 16B.

The temperature measurement unit 12 includes a temperature detection element such as a thermocouple or a thermistor. The temperature detection element is disposed on or near a surface of the secondary battery 11. The temperature measurement unit 12 detects the temperature of the secondary battery 11 by the temperature detection element and outputs the temperature to the determination unit 15.

The current measurement unit 13A measures the current of the secondary battery 11 and outputs the current to the current peak detection unit 13B. The current measurement unit 13A is, for example, a current measurement circuit. The current peak detection unit 13B keeps the maximum value of the current at regular time intervals from the current measured by the current measurement unit 13A, and outputs the maximum value to the determination unit 15. The current peak detection unit 13B is an example of a current peak detection unit that detects the maximum value of the current at regular time intervals. As the current peak detection unit 13B, a current peak holding unit (the peak hold circuit) configured to be able to perform the peak hold for the maximum value of the current as an analog signal is used. From a viewpoint of early detection of the failure of the secondary battery 11, the regular time interval of the current holding is preferably 1 minute or less, more preferably 10 seconds or less, and still more preferably 1 second or less. A lower limit value of the regular time interval is not particularly limited, but is, for example, 10 milliseconds or more.

From the viewpoint of early detection of the failure of the secondary battery 11, the current peak detection unit 13B is preferably configured to be able to detect a current rise (the current peak) having a half-value width of 1 second or less. A detection target by the current peak detection unit 13B is the micro-short circuit derived from metal lithium. An instantaneous rise of the current of the secondary battery 11 and behavior of immediately recovering thereafter are characteristic behaviors observed in the micro-short circuit caused by a dendrite generation. The dendrite generation can be detected by detecting these characteristic behaviors (waveforms) by the current peak detection unit 13B. Accordingly, the determination unit 15 can determine whether the secondary battery 11 is normal or abnormal based on the maximum value of the current input from the current peak detection unit 13B.

The voltage measurement unit 14A measures the voltage of the secondary battery 11 and outputs the voltage to the voltage peak detection unit 14B. The voltage measurement unit 14A is, for example, a voltage measurement circuit. The voltage peak detection unit 14B holds the minimum value of the voltage at regular time intervals from the voltage measured by the voltage measurement unit 14A, and outputs the minimum value thereof to the determination unit 15. The voltage peak detection unit 14B is an example of a voltage peak detection unit that detects the minimum value of the voltage at regular time intervals. As the voltage peak detection unit 14B, a voltage peak holding unit (the peak hold circuit) configured to be able to perform the peak hold for the minimum value of the voltage as the analog signal is used. The regular time interval of voltage holding is preferably 1 minute or less, more preferably 10 seconds or less, and still more preferably 1 second or less from the viewpoint of early detection of the failure of the secondary battery 11. A lower limit value of the regular time interval is not particularly limited, but is, for example, 10 milliseconds or more.

From the viewpoint of early detection of the failure of the secondary battery 11, the voltage peak detection unit 14B is preferably configured to be able to detect a voltage drop (the voltage peak) having the half-value width of 1 second or less. The detection target by the voltage peak detection unit 14B is the micro-short circuit derived from metal lithium. An instantaneous drop of the voltage of the secondary battery 11 and behavior of immediately recovering thereafter are characteristic behaviors observed in the micro-short circuit caused by the dendrite generation. The dendrite generation can be detected by detecting these characteristic behaviors (the waveforms) by the voltage peak detection unit 14B. Accordingly, the determination unit 15 can determine whether the secondary battery 11 is normal or abnormal based on the minimum value of the voltage input from voltage peak detection unit 14B.

The determination unit 15 determines the failure of the secondary battery 11 based on the temperature measured by the temperature measurement unit 12, the current measured by the current measurement unit 13A, the voltage measured by the voltage measurement unit 14A, a maximum current value held by the current peak detection unit 13B, and a minimum voltage value held by the voltage peak detection unit 14B. The determination unit 15 is a processor that executes the above determination by the learned model using the neural network, or an integrated circuit such as an application specific integrated circuit (ASIC).

Specifically, the determination unit 15 includes a storage unit that stores the learned model using the neural network, and determines a failure of the secondary battery 11 using the learned model stored in the storage unit. The neural network includes an input layer and an output layer. Input data of the input layer is (1) the temperature measured by the temperature measurement unit 12, (2) the current measured by the current measurement unit 13A, (3) the voltage measured by the voltage measurement unit 14A, (4) the maximum current value held by the current peak detection unit 13B, and (5) the minimum voltage value held by the voltage peak detection unit 14B. Output data of the output layer is presence or absence of the failure of the secondary battery 11. The presence or absence of the failure of the secondary battery 11 is determined by inputting the data of (1) to (5) to the neural network. The storage unit included in the determination unit 15 is, for example, a nonvolatile memory.

Hereinafter, an example of a failure detection method for battery using the power supply device 10 having the configuration above will be described according to an embodiment.

To start with, the current measurement unit 13A and the voltage measurement unit 14A measure the voltage and the current of the secondary battery 11 respectively, and output the voltage and the current to the current peak detection unit 13B as well as the voltage peak detection unit 14B, and to the determination unit 15. In addition, the temperature measurement unit 12 measures the temperature of the secondary battery 11 and outputs the temperature to the determination unit 15.

Next, the current peak detection unit 13B holds the maximum value of the current at regular time intervals from the current measured by the current measurement unit 13A, and outputs the maximum value to the determination unit 15. In addition, the voltage peak detection unit 14B holds the minimum value of the voltage at regular time intervals from the voltage measured by the voltage measurement unit 14A, and outputs the minimum value thereof to the determination unit 15.

The determination unit 15 inputs, to the neural network, the temperature measured by the temperature measurement unit 12, the current measured by the current measurement unit 13A, the voltage measured by the voltage measurement unit 14A, the maximum current value held by the current peak detection unit 13B, and the minimum voltage value held by the voltage peak detection unit 14B as data to determine the presence or absence of the failure of the secondary battery 11, and outputs a determination result to an external device by, for example, serial communication.

Hereinafter, an example of a configuration of a data collection system used for generating the learned model will be described according to an embodiment.

Figure 2:
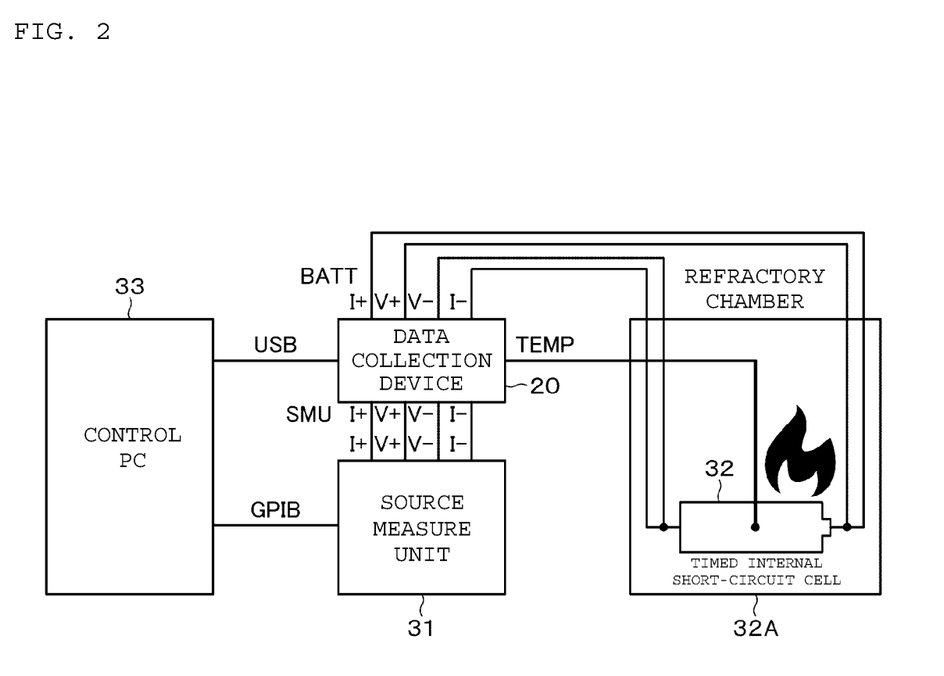
FIG. 2 is a block diagram illustrating an example of a configuration of a data collection system.

FIG. 2 is a block diagram illustrating an example of a configuration of a data collection system. The data collection system includes a data collection device 20, a source measure unit 31, a timed internal short-circuit cell 32, and a control PC 33. The data collection device 20 and the timed internal short-circuit cell 32 are connected by a cable. The data collection device 20 and the source measure unit 31 are connected by a cable. The control PC 33 and the data collection device 20 are connected by a cable such as a universal serial bus (USB). The control PC 33 and the source measure unit 31 are connected by a cable such as a general purpose interface bus (GPIB).

In an abnormality detection technique using machine learning, when only time series data in the normal time is used as teacher data, it is possible to determine as not normal, but it is not possible to determine whether it leads to a thermal runaway. In order to reliably determine that the thermal runaway occurs, it is necessary to prepare the time series data of a case where the thermal runaway occurs as the teacher data and to perform the learning using the data. Thereupon, the timed internal short-circuit cell 32 in which an internal short-circuit will soon occur is produced.

Furthermore, the timed internal short-circuit cell 32 is not obviously different from a commercially available lithium ion battery, but is a cell subjected to processing for causing an internal short-circuit at a predetermined intended timing. There are several preparation methods thereof, and a battery cell can be prepared by, for example, performing continuous charging, high temperature storage, overcharge cycle, or the like, or processing a short source inside the battery cell when assembling the battery cell. The timed internal short-circuit cell 32 is housed within a refractory chamber 32A.

Figure 3:
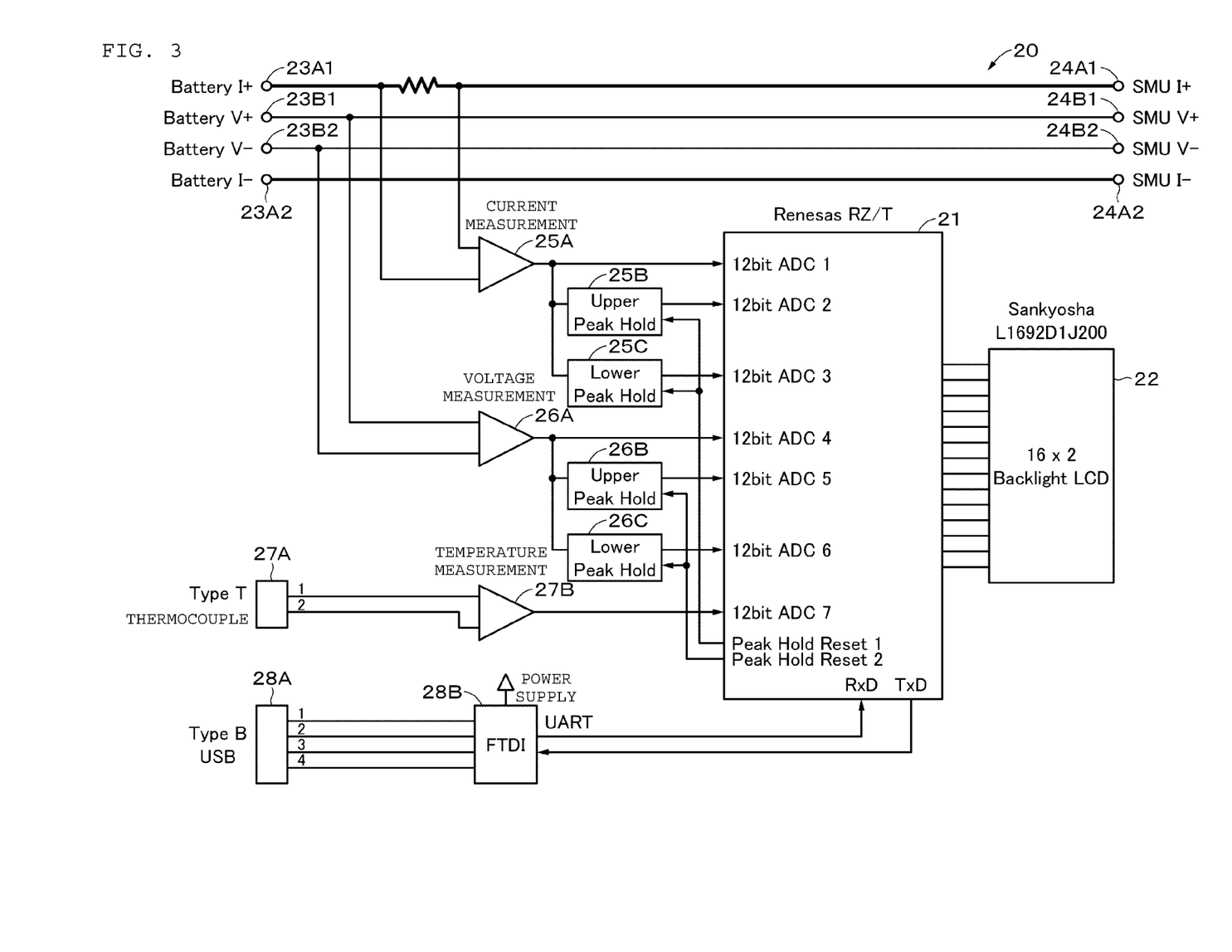
FIG. 3 is a block diagram illustrating an example of a configuration of a data collection device.

FIG. 3 is a block diagram illustrating an example of a configuration of the data collection device 20. The data collection device 20 measures a charge/discharge current, the voltage, and the temperature of the timed internal short-circuit cell 32. In addition, the data collection device 20 detects the minimum value and the maximum value of the current of the timed internal short-circuit cell 32 at regular time intervals and the minimum value and the maximum value of the voltage of the timed internal short-circuit cell 32 at regular time intervals.

The data collection device 20 includes a microcontroller 21 as a control device, a display device 22, positive electrode terminals 23A1, 24A1, 23B1, and 24B1, negative electrode terminals 23A2, 24A2, 23B2, and 24B2, a current measurement unit 25A, an upper peak hold circuit 25B, a lower peak hold circuit 25C, a voltage measurement unit 26A, an upper peak hold circuit 26B, a lower peak hold circuit 26C, a thermocouple 27A as a temperature detection element, a temperature measurement unit 27B, a USB connector 28A, and a USB serial converter 28B.

The positive electrode terminal 23A1 and the positive electrode terminal 24A1 are connected to each other. The negative electrode terminal 23A2 and the negative electrode terminal 24A2 are connected to each other. The positive electrode terminal 23A1 and the negative electrode terminal 23A2 are connected to a positive electrode terminal and a negative electrode terminal of the timed internal short-circuit cell 32 respectively, and the positive electrode terminal 24A1 and the negative electrode terminal 24A2 are connected to a positive electrode terminal and a negative electrode terminal for current control of the source measure unit 31 respectively.

The positive electrode terminal 23B1 and the positive electrode terminal 24B1 are connected to each other. The negative electrode terminal 23B2 and the negative electrode terminal 24B2 are connected to each other. The positive electrode terminal 23B1 and the negative electrode terminal 23B2 are connected to a positive electrode terminal and a negative electrode terminal of the timed internal short-circuit cell 32 respectively, and the positive electrode terminal 24B1 and the negative electrode terminal 24B2 are connected to a positive electrode terminal and a negative electrode terminal for a voltage control of the source measure unit 31 respectively.

The current measurement unit 25A measures a current flowing between the positive electrode terminal 23A1 and the positive electrode terminal 24A1, and outputs the current to the upper peak hold circuit 25B, the lower peak hold circuit 25C, and the microcontroller 21. The upper peak hold circuit 25B holds the maximum current value at regular time intervals from the current measured by the current measurement unit 25A, and outputs the maximum current value to the microcontroller 21. The lower peak hold circuit 25C holds a minimum current value at regular time intervals from the current measured by the current measurement unit 25A, and outputs the minimum current value to the microcontroller 21.

The voltage measurement unit 26A measures a voltage applied between the positive electrode terminal 23B1 and the negative electrode terminal 23B2, and outputs the voltage to the upper peak hold circuit 26B, the lower peak hold circuit 26C, and the microcontroller 21. The upper peak hold circuit 26B holds a maximum voltage value at regular time intervals from the voltage measured by the voltage measurement unit 26A, and outputs the maximum voltage value to the microcontroller 21. The lower peak hold circuit 25C holds the minimum voltage value at regular time intervals from the voltage measured by the voltage measurement unit 26A, and outputs the minimum voltage value to the microcontroller 21.

The thermocouple 27A is disposed on or near a surface of the timed internal short-circuit cell 32. The temperature measurement unit 27B measures the temperature of the timed internal short-circuit cell 32 by the thermocouple 27A and outputs the temperature to the microcontroller 21.

A USB connector 28A is connected to the microcontroller 21 via a USB serial converter 28B. A USB cable is connected to the USB connector 28A. The data collection device 20 and the control PC 33 are connected via the USB cable.

The microcontroller 21 acquires a voltage, a current, a temperature, a minimum voltage value at regular time intervals, the maximum voltage value at regular time intervals, the minimum current value at regular time intervals, and the maximum current value at regular time intervals, and outputs the acquired values to the control PC 33. The microcontroller 21 resets each of the upper peak hold circuits 25B and 26B and the lower peak hold circuits 25C and 26C at regular time intervals. Accordingly, it is possible to read the minimum current value, the maximum current value, the minimum voltage value, and the maximum voltage value at a regular period after a previous reset. The display device 22 displays information related to collected data and the like.

Figure 4:
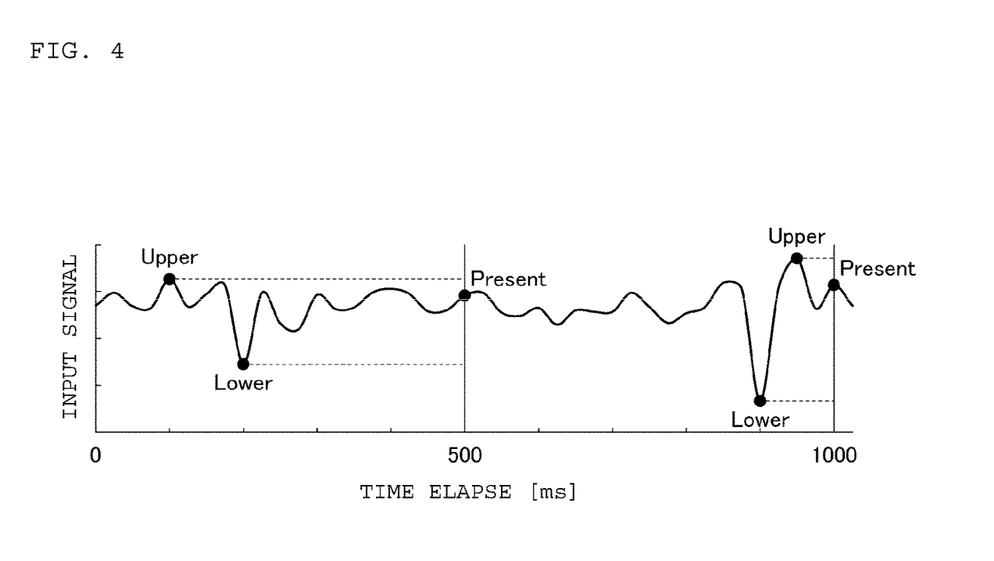
FIG. 4 is a schematic diagram illustrating an example of data collected by a peak hold circuit.

The data collection device 20 is configured to be able to measure, for example, a peak value of a peak having a half-value width of 1 μs or more with an accuracy of 5% or less. The data collection device 20 is equipped with a continuous data transmission function. This is a function of transmitting (1) the value (Present) at that time, (2) the maximum value (Upper) in the latest 500 milliseconds, and (3) the minimum value (Lower) at regular time intervals (for example, every 500 milliseconds) (see FIG. 4).

The source measure unit 31 charges and discharges the timed internal short-circuit cell 32.

The control PC 33 controls the source measure unit 31 to charge and discharge the timed internal short-circuit cell 32. Furthermore, the control PC 33 controls the data collection device 20 to collect data on the timed internal short-circuit cell 32.

Hereinafter, an example of a data collection method using the data collection system having the configuration above will be described according to an embodiment.

The control PC 33 controls the source measure unit 31 to perform a cycle test of the timed internal short-circuit cell 32. Charge conditions in the cycle test are, for example, 1C charge, and discharge conditions are, for example, a current pattern actually applied to the battery in the electric aircrafts. Then, the data collection device 20 measures time-series data of the current, the voltage, the temperature, the minimum current value, the maximum current value, the minimum voltage value, and the maximum voltage value until the timed internal short-circuit cell 32 reaches the thermal runaway. The control PC 33 collects the time-series data measured by the data collection device 20. This charge-discharge cycle test is performed until the timed internal short-circuit cell 32 undergoes an exothermic runaway. This series of data collection is performed using, for example, 200 timed internal short-circuit cells 32.

The time series data of the current, the voltage, the temperature, the minimum current value, the maximum current value, the minimum voltage value, and the maximum voltage value collected by the data collection device 20 is used as the teacher data by using a machine learning platform TensorFlow to create a neural network for abnormality detection.

A neural network created on TensorFlow using Renesas integrated development environment e2 studio is converted into a source code for a microprocessor, and the source code is written into the microprocessor. Then, in combination with the current measurement unit 13A, the current peak detection unit 13B, the voltage measurement unit 14A, the voltage peak detection unit 14B, and the temperature measurement unit 12, the power supply device 10 (see FIG. 1) on which the learned neural network is mounted is prepared.

The power supply device 10 is configured to be able to output (1) how many seconds after which an abnormality occurs and (2) the percentage of certainty of the abnormality.

For example, specifically when a data acquisition interval of the power supply device 10 is every 500 milliseconds, in a case where the current peak detection unit 13B and the voltage peak detection unit 14B capable of detecting the peak value of the peak having the half-value width of 1 μs or more are provided, the current abnormality and the voltage abnormality can be detected in an early stage.

In learning and estimation of the neural network, not only voltage but also current and temperature information are used. Since a voltage waveform for determining the presence or absence of the failure of the secondary battery 11 depends on an internal resistance, and the internal resistance depends on the current and the temperature, more accurate determination can be made by using these three physical quantities.

It is possible to determine whether the battery is normal or abnormal by detecting an instantaneous voltage drop and a voltage behavior that recovers immediately thereafter. However, in the technique described in the Background section (e.g., Japanese Patent Application Laid-Open No. 2003-009405), particularly when a lithium ion battery is to be used as a battery for the electric aircrafts, there are insufficient points, for example, (1) a specific detection means for detecting a voltage waveform thereof; and (2) a specific determination means for determining an obtained waveform.

(1) With Respect to Detection Means

Regarding the instantaneous voltage drop caused by the dendrite generation and the voltage behavior that immediately recovers thereafter, paragraph 0045 of Japanese Patent Application Laid-Open No. 2003-009405 describes that voltage measurement is performed every several tens of milliseconds.

However, specifically when the interval of the voltage measurement is every several tens of milliseconds, it cannot be said that the interval is sufficiently fast. This is because, in the internal short circuit caused by the dendrite, to start with, an extremely thin dendrite is connected between the positive and negative electrodes to cause an internal short circuit, which fuses in an extremely short time, then a slightly thick dendrite is connected between the positive and negative electrodes to cause an internal short circuit, which fuses after a slightly long short circuit time, and then a slightly thicker dendrite is connected, so that the dendrite gradually becomes thicker, and the short circuit time gradually becomes longer. In other words, an earlier dendrite growth can be found, the more it is possible to measure the initial abnormal voltage behavior in an extremely short time. At a measurement interval of several tens of milliseconds, it is difficult to detect such initial dendrite generation, and when the dendrite generation can be detected, there is not much time left until the thermal runaway, and the dendrite generation is detected after a relatively late stage. How much time is needed depends on a use application of the battery. For example, in a battery for electric aircrafts, a time on an order of several tens of minutes at the minimum and a time on an order of several hours when possible are needed as a postponed time from the detection of the internal short circuit to a safe landing of the aircrafts. The measurement interval of every several tens of milliseconds was insufficient for such applications that particularly has high requirement for safety.

In order to be able to measure a high-speed current change and a voltage change that are much shorter than several tens of milliseconds, for example, there is a method of increasing a sampling frequency of an AD converter that reads current behavior and voltage behavior. However, attempting to perform high-speed sampling on a large number of batteries required to drive an electric aircraft would increase an overall cost of the system. In Japanese Patent Application Laid-Open No. 2003-009405, the detection means for preventing the increase in cost is not sufficiently devised.

On the other hand, the power supply device 10 according to an embodiment includes the current peak detection unit 13B and the voltage peak detection unit 14B in order to solve the problem above. The current peak detection unit 13B and the voltage peak detection unit 14B are circuits that continue to hold the maximum value and the minimum value at a regular time interval. Accordingly, this makes it possible to detect the minimum voltage value without increasing the sampling frequency of the AD converter specifically when the current rise or the voltage drop has a very narrow half-value width.

The current peak detection unit 13B configured by a first peak hold circuit and the voltage peak detection unit 14B configured by the second peak hold circuit can be relatively easily constructed by an analog circuit using a rectifier element, and the cost of the circuit can also be suppressed. This is particularly effective in a case where a large number of batteries such as in the electric aircrafts are used.

(2) With Respect to Determination Means

Next is a base voltage. Japanese Patent Application Laid-Open No. 2003-009405 describes a threshold voltage for determining that the detection value of the voltage detection unit has instantaneously dropped. However, a degree of a voltage minimal value of the voltage drop due to the micro-short circuit depends on the internal resistance of the battery, and the internal resistance depends on the degree of deterioration, the temperature, and the like. Therefore, when the base voltage is used as a determination reference, it is necessary to separately prepare a measurement means of the internal resistance of the battery and the like, and sequentially change the base voltage using an obtained internal resistance value. However, Japanese Patent Application Laid-Open No. 2003-009405, such discussion is not sufficiently made, and a scientific basis for determination criteria is insufficient.

On the other hand, in the power supply device 10 according to an embodiment, a neural network is used to solve the above problems. When the neural network is learned, not only voltage information but also current and temperature information are used. The internal resistance of the battery is a physical quantity dependent on the voltage, the current, and the temperature. Therefore, by using these three pieces of data for learning and estimation, more accurate determination based on the internal resistance can be made.

The data used for learning and estimation of the neural network is not limited to the three pieces of data of the voltage, the current, and the temperature. Data obtained by the current peak detection unit 13B and the voltage peak detection unit 14B is also used as information on the voltage rise and the voltage drop having a very narrow half-value width. Accordingly, a determination accuracy can be further improved.

In an embodiment described above, the power supply device 10 may not include the temperature measurement unit 12. In this case, the data collection device 20 may not include the thermocouple 27A and the temperature measurement unit 27B.

In an embodiment described above, the power supply device 10 may not include the current measurement unit 13A and the current peak detection unit 13B. In this case, the data collection device 20 may not include the current measurement unit 25A, the upper peak hold circuit 25B, and the lower peak hold circuit 25C.

In an embodiment described above, the power supply device 10 may not include the voltage measurement unit 14A and the voltage peak detection unit 14B. In this case, the data collection device 20 may not include the voltage measurement unit 26A, the upper peak hold circuit 26B, and the lower peak hold circuit 26C.

In an embodiment described above, an example in which the power supply device 10 includes one secondary battery 11 and the data collection system includes one timed internal short-circuit cell 32 has been described. However, the power supply device 10 may include a plurality of secondary batteries 11 and the data collection system may include a plurality of timed internal short-circuit cells 32. In this case, the current measurement unit 13A of the power supply device 10 may measure the currents of the plurality of secondary batteries 11 connected, and the voltage measurement unit 14A of the power supply device 10 may measure the voltage of each secondary battery 11. In addition, the current measurement unit 25A of the data collection device 20 may measure the currents of the plurality of timed internal short-circuit cells 32 connected, and the voltage measurement unit 26A of the data collection device 20 may measure the voltage of each timed internal short-circuit cell 32.

In an embodiment described above, an example in which the power supply device 10 includes the current measurement unit 13A, the current peak detection unit 13B, the voltage measurement unit 14A, and the voltage peak detection unit 14B has been described. However, the sampling frequency of the AD converter that reads the current behavior and the voltage behavior may be increased to detect the maximum current value and the minimum voltage value.

Although an embodiment including the modification examples of the present application have been described above, the present application is not limited thereto and various modifications can be made.

For example, the configurations, methods, steps, shapes, materials, numerical values, and the like described in an embodiment and modification examples described above are merely examples, and different configurations, methods, steps, shapes, materials, numerical values, and the like may be used as necessary.

In addition, the configurations, methods, steps, shapes, materials, numerical values, and the like of an embodiment including modification examples described above can be combined with each other without departing from the present application.

DESCRIPTION OF REFERENCE SYMBOLS

10: Power supply device
11: Secondary battery
12, 27B: Temperature measurement unit
13A, 25A: Current measurement unit
13B: Current peak detection unit
14A, 26A: Voltage measurement unit
14B: Voltage peak detection unit
15: Determination unit
16A, 23A1, 23B1, 24A1, 24B1: Positive electrode terminal
16B, 23A2, 23B2, 24A2, 24B2: Negative electrode terminal
20: Data collection device
21: Microcontroller
22: Display device 25B, 26B: Upper peak hold circuit
25C, 26C: Lower peak hold circuit
27A: Thermocouple
28A: USB connector
28B: USB serial converter
31: Source measure unit
32: Timed internal short-circuit cell
32A: Refractory chamber
33: Control PC It should be understood that various changes and modifications to the presently preferred embodiments herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A power supply device comprising:
a measurement unit configured to measure a voltage and a current of a lithium ion battery;
a peak detection unit configured to detect a maximum value of the current and a minimum value of the voltage at regular time intervals using the voltage and the current measured by the measurement unit; and
a determination unit configured to determine a failure of the lithium ion battery based on the maximum value of the current and the minimum value of the voltage detected at the regular time intervals by the peak detection unit,
wherein the peak detection unit is a peak holding unit that holds the maximum value of the current and the minimum value of the voltage at the regular time intervals from the voltage and the current measured by the measurement unit,
wherein the measurement unit comprises a current measurement unit and a voltage measurement unit,
wherein the peak holding unit comprises an upper peak hold circuit and a lower peak hold circuit,
wherein the determination unit comprises a microcontroller,
wherein the current measurement unit outputs the current to the upper peak hold circuit and the microcontroller, the voltage measurement unit outputs the voltage to the lower peak hold circuit and the microcontroller,
wherein the upper peak hold circuit outputs the maximum current value to the microcontroller at the regular time intervals and the lower peak hold circuit outputs the minimum voltage value to the microcontroller at the regular time intervals, and
wherein the microcontroller resets the upper peak hold circuit and the lower peak hold circuit at the regular time intervals.

2. The power supply device according to claim 1, further comprising a temperature measurement unit configured to measure a temperature of the lithium ion battery,
wherein the determination unit determines the failure of the lithium ion battery based on the maximum value of the current and the minimum value of the voltage detected by the peak detection unit, at least one of the voltage and the current measured by the measurement unit, and the temperature measured by the temperature measurement unit.

3. The power supply device according to claim 1, further comprising a temperature measurement unit configured to measure a temperature of the lithium ion battery,
wherein the determination unit determines the failure of the lithium ion battery based on the maximum value of the current and the minimum value of the voltage detected by the peak detection unit, the voltage and the current measured by the measurement unit, and the temperature measured by the temperature measurement unit.

4. The power supply device according to claim 1, wherein the determination unit determines the failure of the lithium ion battery using a learned model using a neural network.

5. The power supply device according to claim 1, wherein each of the regular time intervals is 1 minute or less.

6. A failure detection method for a battery, comprising:
measuring, by a measuring unit, a voltage and a current of a lithium ion battery;
detecting, by a peak detection unit, a maximum value of the current and a minimum value of the voltage at regular time intervals using the measured voltage and the measured current;
determining, by a microcontroller, the failure of the lithium ion battery based on the maximum value of the current and the minimum value of the voltage detected at regular time intervals, wherein
the detecting includes holding, by a peak holding unit, the maximum value of the current and the minimum value of the voltage at the regular time intervals from the voltage and the current measured by the measurement unit,
the measurement unit comprises a current measurement unit and a voltage measurement unit,
the peak holding unit comprises an upper peak hold circuit and a lower peak hold circuit,
the measuring includes outputting, by the current measurement unit, the current to the upper peak hold circuit and the microcontroller, and outputting, by the voltage measurement unit, the voltage to the lower peak hold circuit and the microcontroller, and
the upper peak hold circuit outputs the maximum current value to the microcontroller at the regular time intervals and the lower peak hold circuit outputs the minimum voltage value to the microcontroller at the regular time intervals; and
resetting, by the microcontroller, the upper peak hold circuit and the lower peak hold circuit at the regular time intervals.

\* \* \* \* \*